Figure 1:
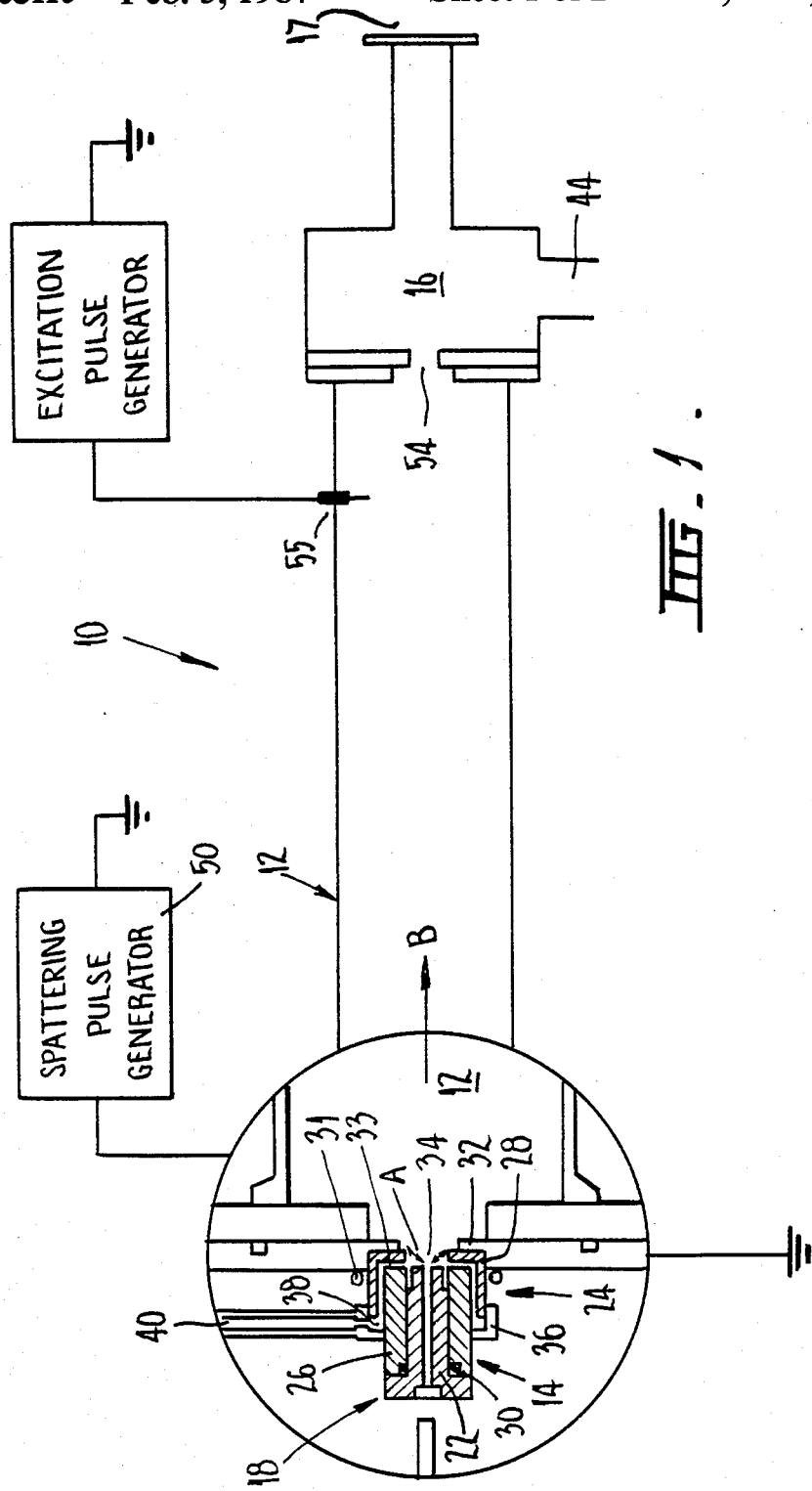

United States Patent [19]

Tobin et al.

[11] Patent Number: 4,641,313
[45] Date of Patent: Feb. 3, 1987

[54] ROOM TEMPERATURE METAL VAPOUR LASER

[75] Inventors: Roderick C. Tobin, Mount Waverley; Nigel D. Perry, Altona, both of Australia

[73] Assignee: Monash University, Clayton, Australia

[21] Appl. No.: 644,955

[22] Filed: Aug. 28, 1984

[30] Foreign Application Priority Data

Jun. 15, 1984 [AU] Australia ............................. PG5528

[51] Int. Cl.⁴ ............................................. H01S 3/22
[52] U.S. Cl. ...................................... 372/56; 372/86; 372/87; 372/58
[58] Field of Search ....................... 372/56, 55, 83, 85, 372/87, 88, 103, 59, 86, 58

[56] References Cited

U.S. PATENT DOCUMENTS

| | | | |
|---|---|---|---|
| 3,621,460 | 11/1971 | Willett | 372/56 |
| 3,721,915 | 3/1973 | Reily | 372/85 |
| 3,811,095 | 5/1974 | Rich et al. | 372/85 |
| 3,868,593 | 2/1975 | Fukuda et al. | 372/56 |
| 3,936,772 | 2/1976 | Sucov et al. | 372/56 |
| 3,946,332 | 3/1976 | Samis | 372/56 |
| 4,510,608 | 4/1985 | Fujii et al. | 372/88 |

OTHER PUBLICATIONS

Bergmann et al. "Apparatus for Production of Photopreconization Stabilized Nanosecond Discharges at High Temperatures and Pressures"; *J. Phys. E: Sci. Inst.*, vol. 12, 1979, pp. 1103–1105.

*Primary Examiner*—Leon Scott, Jr.
*Attorney, Agent, or Firm*—Finnegan, Henderson, Farabow, Garrett & Dunner

[57] ABSTRACT

A metal vapour laser is disclosed having an optical cavity with a sputtering cathode and anode located at one end of the cavity. The sputtering cathode and anode includes a gaseous jet inlet to introduce a gas stream of inert gas into the optical cavity for entraining metal vapour sputtered by the sputtering cathode and anode. An electrical discharge separate to the sputtering cathode and anode is provided in the optical cavity for exciting the metal vapour entrained in the inert gas stream.

4 Claims, 2 Drawing Figures

ROOM TEMPERATURE METAL VAPOUR LASER

This invention relates to metal vapour lasers.

A major cause of technical difficulties and limitations in the operation of metal vapour lasers is the method by which the metal atoms are established within the laser discharge volume. Conventional methods of vaporizing the metal to provide metal atoms have limitations.

Direct vaporization of the metal (Walter et al 1966) using either an external oven or discharge heating requires high temperatures, about 1500° C. for copper, to be achieved. High power copper and gold lasers exploit the discharge energy to heat a tube. The need for ovens also makes it difficult to construct the fast discharge circuitry needed for excitation of other potentially interesting self-terminating neutral metal laser transitions.

The use of a volatile compound of the metal (Chen et al 1973), for example a metal halide, reduces the temperatures needed to attain an adequate metal concentration. However, relatively few metals possess suitable compounds. The difficulty in constructing closely coupled discharge circuitry needed for fast discharges in self-terminating lasers, however, still remains. Associated with the use of volatile metal compounds is the need to dissociate the molecule. In the case of neutral transition lasers this requires the use of double or continuously pulsed discharges, with all the limitations that the constraints set by the dissociation-reassociation cycle impose upon the system. In particular, the dissociation process results in an undesirable population of the lower laser level. In contrast, continuous-wave (cw) metal ion lasers use a dc discharge which produces both dissociation and excitation. The dissociation is virtually complete so that the vapour pressure is controlled by tube temperature and consequently the excitation may be separately optimized (Brandt and Piper 1977).

Another commonly used method of metal production is by sputtering the metal atoms from a cathode of the desired material (Gersternberger et al 1980). To date, the metal density required to support laser action has been produced by cathodic sputtering using a hollow cathode discharge. Use of a hollow cathode also greatly increases the extent of ionization in the buffer gas over that found in the more common positive column type gas discharge. This combined with enhancement of charge transfer reactions of the type:

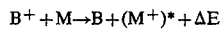
$$B^+ + M \rightarrow B + (M^+)^* + \Delta E$$

where B, $B^+$ and M represent buffer gas atoms, ions and metal atoms respectively and $(M^+)^*$ represents metal ions in excited states, results in the hollow cathode discharge being particularly suitable for charge transfer metal ion lasers. Indeed, thus far, sputtering has been restricted to cw metal ions lasers, which require relatively high discharge currents (1 to 100 A).

A theory for the operation of this type of hollow cathode ion laser has been developed by Warner et al (1979). In their model the equations for the densities of the rare gas ions, metal vapour atoms and ions are coupled via the charge transfer reaction as above. As a consequence of this the discharge current cannot be independently varied or optimized with respect to the desired metal atom density. This restriction is the major practical disadvantage of sputtering lasers to date.

Only sputtering is applicable to a wide range of metals and can produce a concentration of metal atoms of the order $10^{14}$ cm$^{-3}$ continuously at room temperature.

In existing sputtering lasers, both the sputtering of the metal and the excitation of the lasing transition are accomplished by a single discharge in a static noble gas metal vapour mixture. The conventional methods do not allow separate control and optimisation of the metal vapour concentration and the excitation discharge. The object of the present invention is to provide a metal vapour laser for operation at room temperature which overcomes some or all of the abovementioned drawbacks.

In a first aspect the invention may be said to reside in a metal vapour laser including an optical cavity, sputtering means for sputtering a metal to provide a metal vapour beam in the cavity, said sputtering means comprising a sputtering cathode and anode for producing an electrical discharge to sputter said metal and means for producing a gas stream for entraining the sputtered metal into a metal vapour beam within said optical cavity.

Since the sputtering means sputters the metal by means of an electrical discharge the device can be operated at room temperature.

The invention in a second aspect may be said to reside in a metal vapour laser having an optical cavity, sputtering means for sputtering a metal to produce a metal vapour, said sputtering means including first electrical discharge means for sputtering the metal and said laser having second separate electrical discharge means arranged in said optical cavity for exciting the metal vapour.

Since this aspect of the invention provides separate electrical discharge means for sputtering the metal and for exciting the metal vapour optimum metal vapour concentration can be obtained for any particular metal as well as optimum concentration of the electrical discharge for exciting the metal vapour.

Preferably the sputtering means further includes means for producing a gaseous jet for entraining sputtered metal and forming a metal vapour beam in the optical cavity. Preferably the sputtering means is located at one end of the optical cavity and the other end of the optical cavity is provided with an outlet aperture which communicates with a chamber, the chamber having an outlet for connection to a vacuum pump for drawing the metal vapour beam entrained in the gas stream coaxially through the optical cavity. Preferably the sputtering means comprises a cathode, a cylindrical insulator surrounding said cathode, the insulator having an opening for exposing the cathode to the optical cavity, an anode disposed adjacent to the portion of the cathode which is exposed to the optical cavity, said anode being spaced from the cathode and an annular channel between said anode and the portion of the cathode exposed to the cavity for supplying a gaseous jet such that when electrical discharge occurs between the anode and the portion of the cathode exposed to the optical cavity the metal of the cathode is sputtered and entrained in the gas flow to produce a metal vapour beam in the optical cavity. The cathode may comprise a sputtering cathode formed from the metal from which the metal vapour is produced or the cathode may comprise a cathode plug having a sputtering cathode portion located at its end which is exposed to the optical cavity. Preferably a gap is provided between the insulator and the portion of the cathode whidh is to be sputtered.

The invention in a third aspect may also be said to reside in a method of exciting a metal vapour beam comprising the steps of producing the metal vapour beam, arranging an electrode adjacent to said beam and causing electrical discharge from said electrode to said beam.

It has been found that by. arranging the electrode adjacent to the beam the discharge is drawn predominantly into the metal vapour beam in preference to atmosphere surrounding the beam. Accordingly the electrical current required to provide a necessary electrical discharge to excite the beam is greatly reduced.

Preferably the electrode comprises a ringshaped electrode through which the beam passes. However, the electrode may be in the form of a pin arranged perpendicular to the beam.

Preferably the metal vapour beam is produced in a noble gas atmosphere and said metal vapour beam is entrained in a noble gas jet stream.

Figure 2:
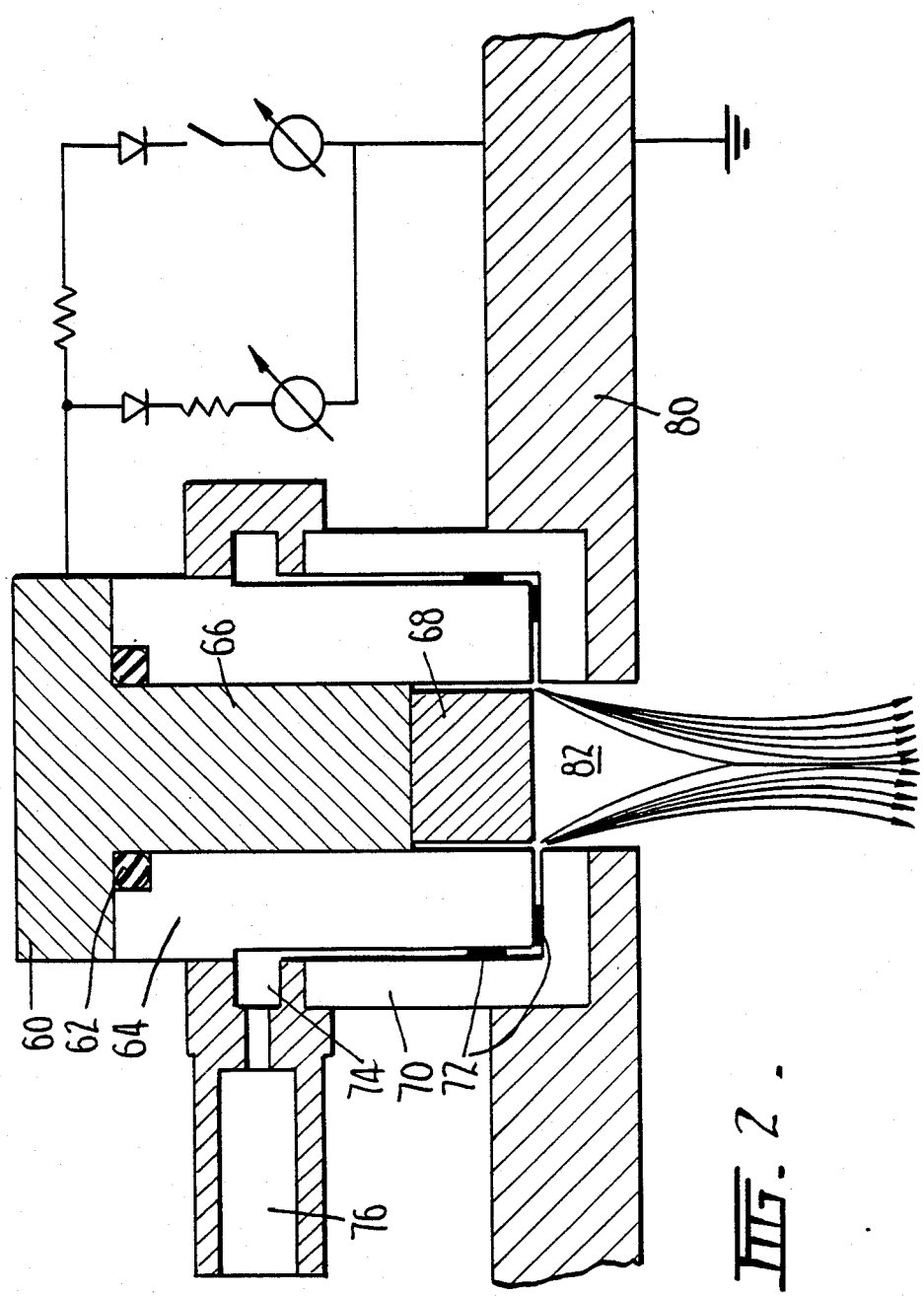

A preferred embodiment of the invention will be described with reference to the accompanying drawings in which:

FIG. 1 is a schematic view of a laser embodying the invention which includes a sputtering means according to a first embodiment of the invention; and FIG. 2 is a view of a sputtering means according to a second embodiment of the invention.

With reference to FIG. 1 a metal vapour laser 10 is shown which comprises an optical cavity 12 formed of non-conducting material such as glass which has a sputtering means 14 at one end and a chamber 16 having a quartz window 17 at the other end. According to a first embodiment of the invention the sputtering means 14 comprises an annular T-shaped sputtering cathode 18 which has an optical outlet cavity 20 axially therethrough with a means for excluding the sputtering discharge from the cavity. A stem portion 22 of the cathode 18 is retained in a discharge arrester 24. The arrester 24 is cylindrical in nature and is open at both ends so that a portion of the stem 22 is exposed to the cavity 12 and so that the cathode 18 can be removed from the arrester 24. The arrester is comprised of three parts: an inner cylinder of Macor (trade mark) ceramic 26 an outer cylinder and cap of Macor ceramic 28 spaced from the inner cylinder 26 to provide an annular passage 33 for the passage of noble gas across the end of the cathode stem 22. The inner Macor cylinder 26 and outer Macor cylinder 28 are fixed in position by the locking ring 36 which defines an annular chamber 38 which communicates with the passage 33 and noble gas inlet 40. The cathode 18 is sealed in the arrester 24 by an O-ring 30. The arrester is sealed to an annular anode 32 by an O-ring 31 immediately behind an opening 34 in the anode 32 to expose the cathode 18 to the cavity 12. The anode 32 which is grounded forms one end wall of the cavity 12.

It should also be noted that the end of the stem portion 22 of the cathode 18 which is to be sputtered is of reduced diameter and spaced from the arrestor 24.

The chamber 16 at the other end of the cavity 12 has an outlet 44 for connection to a vacuum pump (not shown). A sputtering pulse generator 50 is provided for applying pulsing current to the cathode 18. On application of a pulsing current to the cathode 18 an electrical discharge takes place between the anode 32 and the cathode 18 as shown by arrows A. The electrical discharge sputters the metal at the reduced diameter end portion of the cathode stem 22 and the sputtered metal is entrained in a jet stream produced when argon gas enters inlet 40, passes through annular chamber 38 and the passage 33 and which is then drawn in the direction of arrow B through opening 54, which joins the cavity 12 with the chamber 16, by the vacuum pump coupled to outlet 44. This produces a coaxial beam of metal vapour entrained in argon gas in the cavity 12. The cavity 12 contains a noble gas atmosphere which for economic reasons is preferably argon but may be neon or any mixture of noble gases.

An electrode 55 (not shown in detail) is arranged adjacent the opening 54 and is coupled to an excitation pulse generator for providing an electrical discharge to excite the metal vapour beam. The electrode can be a pin type electrode arranged adjacent to the beam or can comprise a ring type electrode through which the beam passes. It has been found that the electronic discharge is drawn directly into the metal vapour beam rather than into the noble gas atmosphere surrounding the beam and therefore minimal current is required to provide the electrical discharge for exciting the metal vapour beam. A glass disc insulator 35 is provided to shield the end wall 37 from the electrode 55. The insulator 35 has an annular opening which coincides with the opening 34.

With reference to FIG. 2 which shows a second embodiment of the sputtering means which comprises a cathode plug 60 held by an O-ring 62 in a Macor ceramic cylinder 64. The end of stem portion 66 of the plug 60 is in contact with a sputtering cathode 68 formed from the metal from which the metal vapour is to be produced. A second annular Macor ceramic insulator 70 is disposed around the inner end of the insulator 64 and is spaced therefrom by spacer ribs and feet 72. The space between the insulator 64 and 70 forms a gas flow passage which terminates in an annular outlet adjacent the sputtering cathode 68. The gas flow passage communicates with an annular chamber 74 which has a gas inlet 76. A grounded anode plate 80 is arranged at the inner end of the insulator 70 and includes an opening 82 for exposing the sputtering cathode 68 to the optical cavity (not shown in FIG. 2). On production of an electrical discharge between the anode plate 80 and the sputtering cathode 68 the metal of the sputtering cathode is sputtered and entrained in an argon gas jet stream which is produced by connecting an argon gas source to the gas inlet 68. This enables argon gas to flow through the annular chamber 74, the gas flow passage and the optical cavity with the assistance of the vacuum pump described with reference to FIG. 1. The sputtered metal is entrained in the argon jet stream to produce a metal vapour beam in the cavity.

The power supply for producing the discharge current between the anode 80 and the cathode 68 generally includes a pulse voltage source and a dc simmer voltage source.

The sputtering means described with reference to FIGS. 1 and 2 entrains the metal atoms in a gas jet, to form a collimated metal vapour beam with a local concentration of the order of $10^{14}$ cm$^{-3}$. The gas flow, in this device, decouples the processes responsible for the sputtering and subsequent excitation of the metal atoms, allowing separate discharges and independent control of the metal atom density and excitation discharge current. The highest concentration achieved, at a current density of 550 mA cm$^{-2}$, is similar to that obtained at the same current density in hollow cathode metal ion sputtering lasers. However, the geometry of the hollow cathode discharge requires a much larger cathode area to achieve a sufficient gain path, and necessitates a cathode current one to two orders of magnitude higher than is used in the preferred embodiment of the present invention.

The high metal atom ground state concentration, low metal requirement, and independent control of the sputtering and excitation currents, make this invention suitable as a source of metal vapour for self-terminating neutral laser transitions (e.g. copper $^2P_{3/2} \rightarrow {}^2D_{5/2}$, 510.6 nm).

In an alternative embodiment the sputtering means could comprise a sputtering cathode, arrester and anode of geometry other than circular or annular to produce a planar sheet of metal vapour, together with a cylindrical hollow cathode with a slit extending along its length for receiving said planar beam of metal vapour so that the metal atoms are excited by means of a discharge within said hollow cathode.

The preferred embodiment of the present invention provides the following advantages:

Separate electrical discharges for producing metal vapour and for exciting the metal vapour which provides great flexibility in the control of the concentration of the excitation discharge.

Hence combinations such as a dc sputtering discharge with a dc exciting discharge (continuous-wave metal ion laser) or a dc sputtering discharge with a pulsed exciting discharge (pulsed neutral metal atom laser) would be possible.

In view of the provision of the separate electrical discharges for producing the metal vapour and for exciting the vapour the device can operate at room temperature whereas many of the prior art devices require the application of extremely high temperatures to produce the metal vapour.

Sputtering of the cathode enables a wide range of metals or alloys or even compounds to be used as an excitation medium in the laser and also enables simultaneous operation using several different metals. Furthermore the vapour pressure of each of the different metals can be separately controlled.

The present device is also simple in structure and inexpensive to produce.

Technical simplicity of construction would result from room temperature operation. Specifically, the design of a transversely-excited laser tube for pulsed neutral metal atom transitions would be considerably simplified.

The threshold discharge current for a continuous-wave laser would be significantly reduced due to more efficient sputtering and due to the independent optimization of the sputtering and excitation processes.

Simultaneous operation on several wavelengths, e.g. a white light laser, could be achieved by means of separate, independently optimized sputtering of the appropriate metals. This would allow independent control of the partial pressure of each metal in the vapour.

A wide range of metals can be sputtered. The gas-jet assisted sputtering enables "difficult" metals such as aluminium to be efficiently sputtered. Thus the underlying concept of this laser could be applied to most metals and should permit the operation of new transitions.

Since modifications within the spirit and scope of the invention may readily be effected by persons skilled within the art, it is to be understood that this application is not limited to the particular embodiment described by way of example hereinabove.

We claim

1. A room temperature metal vapour laser having an optical cavity, a sputtering cathode and an anode located at one end of said cavity, said sputtering cathode having a sputtering surface exposed to the optical cavity, power supply means for producing a first electrical discharge between the sputtering cathode and the anode to vapourize a metal from the sputtering surface, a gaseous jet means for introducing an inert gas stream into the optical cavity and in flowing contact with said sputtering surface to entrain metal vapour from said sputtering surface into a collimated beam in the optical cavity, a second electrical discharge means having an electrode adjacent to said collimated beam in the optical cavity separate and remote from the sputtering cathode surface and said anode for exciting the metal vapour entrained in said inert gas stream such that said discharge is drawn into the collimated metal vapour beam in preference to atmosphere surrounding the beam.

2. A metal vapour laser according to claim 1 wherein the sputtering cathode is at least partly formed from the metal to be vapourized.

3. A metal vapour laser according to claim 2 wherein the anode is an end wall of the optical cavity and has an opening therein, said sputtering cathode being arranged exteriorly of the optical cavity adjacent the opening in the end wall.

4. A metal vapour laser according to claim 1 wherein a vacuum pump is connected to said optical cavity remote from said sputtering cathode for drawing said collimated metal vapour beam coaxially through the optical cavity.

* * * * *